United States Patent
An et al.

(10) Patent No.: US 11,683,905 B1
(45) Date of Patent: Jun. 20, 2023

(54) CONNECTION MECHANISM WITH DUAL AXES OF TRAVEL

(71) Applicant: ZT Group Int'l, Inc., Secaucus, NJ (US)

(72) Inventors: Chen An, Secaucus, NJ (US); Mahesh Kumar Varrey, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/831,853

(22) Filed: Jun. 3, 2022

(51) Int. Cl.
*H05K 7/14* (2006.01)
*H05K 7/18* (2006.01)

(52) U.S. Cl.
CPC ......... *H05K 7/1492* (2013.01); *H05K 7/1409* (2013.01); *H05K 7/1424* (2013.01); *H05K 7/1489* (2013.01); *H05K 7/183* (2013.01)

(58) Field of Classification Search
None
See application file for complete search history.

(56) References Cited

U.S. PATENT DOCUMENTS

| | | | | |
|---|---|---|---|---|
| 5,657,204 A * | 8/1997 | Hunt | .................. | H05K 7/1409 361/752 |
| 6,128,196 A * | 10/2000 | Hoyle, Jr. | ............ | H05K 7/1409 206/706 |
| 6,288,911 B1 * | 9/2001 | Aoki | .................. | H05K 7/1409 361/801 |
| 6,411,517 B1 * | 6/2002 | Babin | ................. | H05K 7/1461 361/759 |
| 9,214,749 B2 * | 12/2015 | Li | .................. | H01R 13/62944 |
| 2011/0292620 A1 * | 12/2011 | Hayashi | ............... | H05K 7/1409 361/748 |

* cited by examiner

*Primary Examiner* — James Wu
*Assistant Examiner* — Christopher Laugustin
(74) *Attorney, Agent, or Firm* — Dergosits & Noah LLP; Todd A. Noah

(57) ABSTRACT

A connection mechanism is provided with a circuit board that replaces internal chassis cabling to multiple electronic devices. In use, the motion of a lever of the connection mechanism drives a carrier of the circuit board in one direction to make an electrical connection at a side of the circuit board. Continued motion of the lever drives the carrier downward to make an additional electrical connections at the bottom of the circuit board.

10 Claims, 16 Drawing Sheets

CONNECTION MECHANISM WITH DUAL AXES OF TRAVEL

BACKGROUND

Current servers usually are cluttered with cables running between different boards or from components, which creates difficulties during servicing.

Thus, what is needed is a connector design that maximizes internal server space by removing extraneous cables and the room for servicing them.

BRIEF DESCRIPTION OF THE DRAWINGS

The embodiments are illustrated by way of example and not limitation in the accompanying drawings, in which like references indicate similar elements, and in which.

DETAILED DESCRIPTION

In embodiments, a connector system maximizes internal chassis space and provides for improved electronic device density, e.g., computer and storage density, by providing a PCB to replace internal cabling.

An issue is that a PCB is a solid entity that is not easily disconnected from connections that have different orientations. In an embodiment, the connector system replaces the cabling with a PCB that travels along two axes to make the connections between the chassis and the electronic devices. In an embodiment, the travel along two axes may be achieved using a single rotating lever.

Embodiments generally provide benefits including one or more of: 1) the process of connecting to the electronic devices is intuitive—almost automatic; 2) the force required for the connection is evenly distributed among the connectors reducing the potential for damage and mis-alignment during servicing; 3) the use of a lever provides a force multiplier that reduces effort required to connect and disconnect; 4) the travel of the PCB during connection and disconnection is controlled and constrained, which potentially reduces error during assembly and servicing; 5) internal cabling is significantly reduced in pursuit of a few-to-none internal cable design; and 6) a modularized carrier/slider/elevator mechanism is provided that may be incorporated into different platforms.

Figure 1:
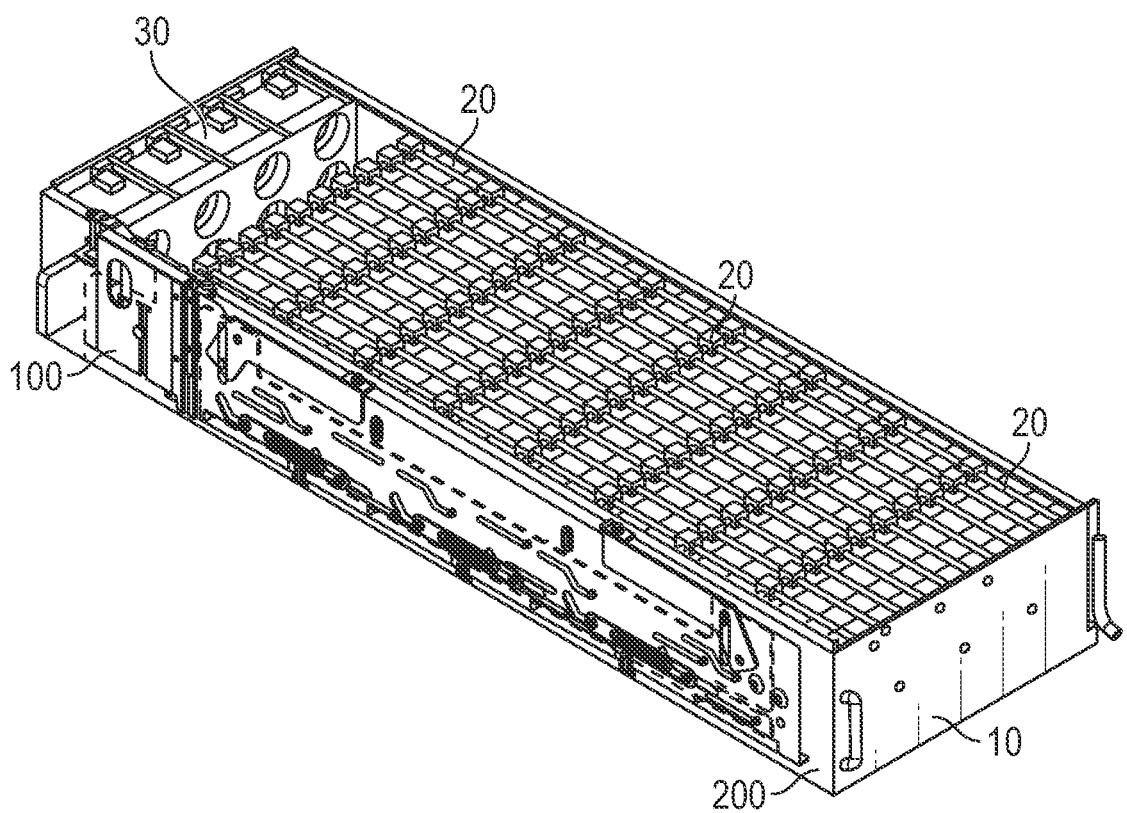
FIG. 1 is an isometric upper right front view illustrating an embodiment of a connection mechanism in a use case.

FIG. 1 is an isometric upper right front view illustrating an embodiment of a connection mechanism 100 with dual axes of travel in a use case, e.g., a chassis 10 including a face 200 is densely populated with electronic devices 20. For example, chassis 10 may be a JBOD chassis and devices 20 may be storage drives. Electronic devices 20 are electrically connected to backplanes 700a-d (FIG. 7), which are themselves connected to chassis signal and power cabling 30 through connection mechanism 100.

Figure 2:
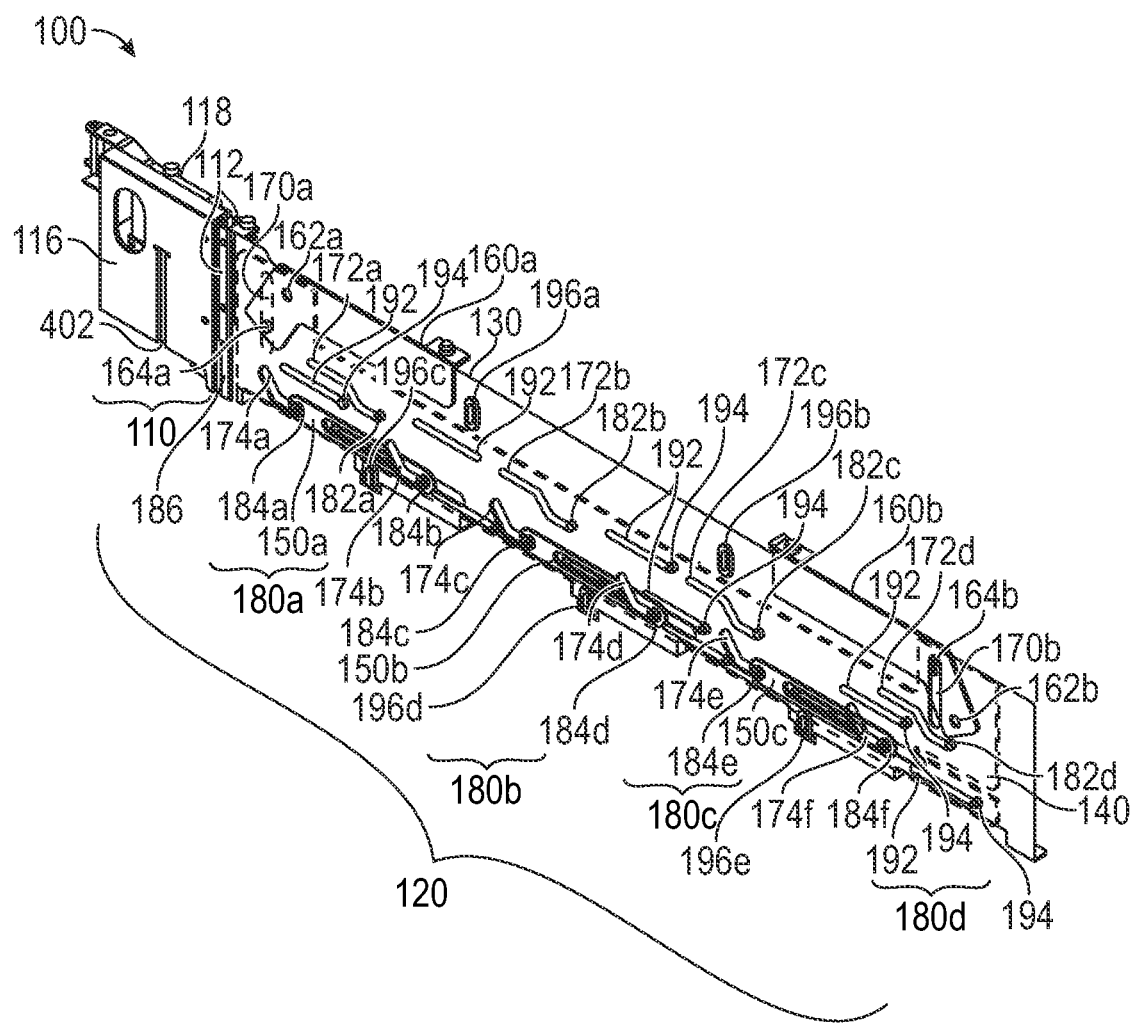
FIG. 2 is an isometric upper right front view illustrating the embodiment of a connection mechanism of FIG. 1.

FIG. 2 is an isometric upper right front view illustrating the embodiment of connection mechanism 100 of FIG. 1. In FIG. 2, face 200 of chassis 10 has been rendered transparent. Linking slider 140 is depicted using dashed lines to indicate it is behind elevator 130. Connection mechanism 100 is shown to include a paddle card cage 110 electrically connected by connector 112 to a cam-slider system 120. In the embodiment, the electrical connection of electronic devices 20 to chassis signal and power cabling 30 includes backplane connectors 702a-d (FIG. 7) connected a PCB 320 (FIG. 3) of cam-slider system 120 by PCB connectors 322a-d (FIG. 3), a paddle card 404 (FIG. 4) of paddle card cage 110 connected to PCB 320 by paddle card connectors 112a-b (mating parts of connector 112) to chassis signal and power cabling 30. A fan linking board connector 408 (FIG. 4) is connected by chassis connectors 114a-b (FIG. 9A) to a fan board 714 (FIG. 7) and by cabling (not shown) to chassis signal and power cabling 30.

As shown in FIG. 2, paddle card cage 110 includes a front shell 116 and a rear shell 118 housing paddle card 111 and to which connector 112 is attached. As will be described further within, the movement of paddle card cage 110 is constrained to vertical motion.

Cam-slider system 120 includes face 200, an elevator 130, a slider 140, mini-sliders 150a-c, handles 160a-b, and cooperates with the adjacent face of chassis 10. Handles 160a-b are pivotable about pivots 162a-b with respect to elevator 130.

Figure 8A:
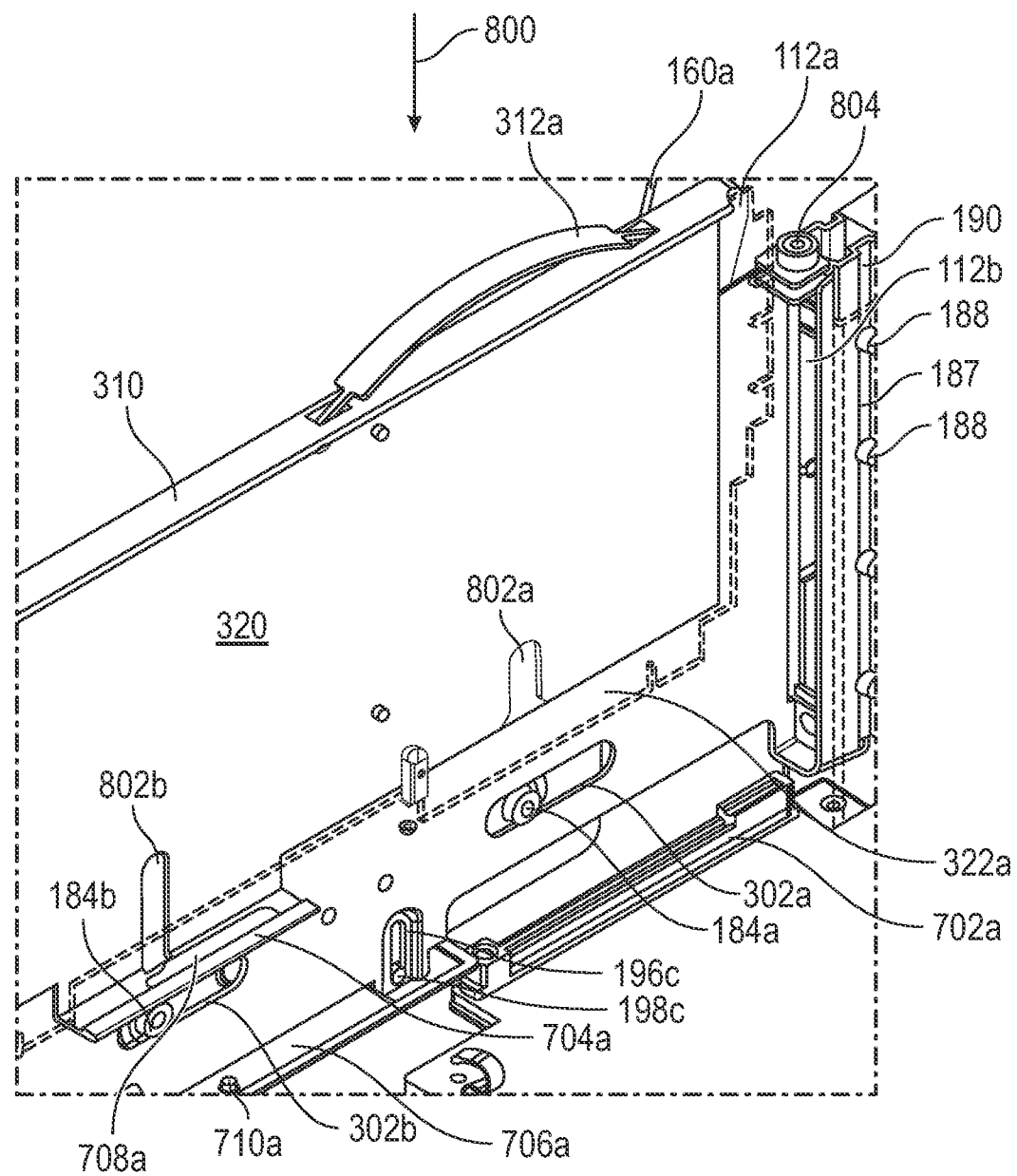
FIG. 8A is an isometric upper right rear view illustrating elements of the embodiment of a connection mechanism of FIG. 1 in a first state.
Figure 9A:
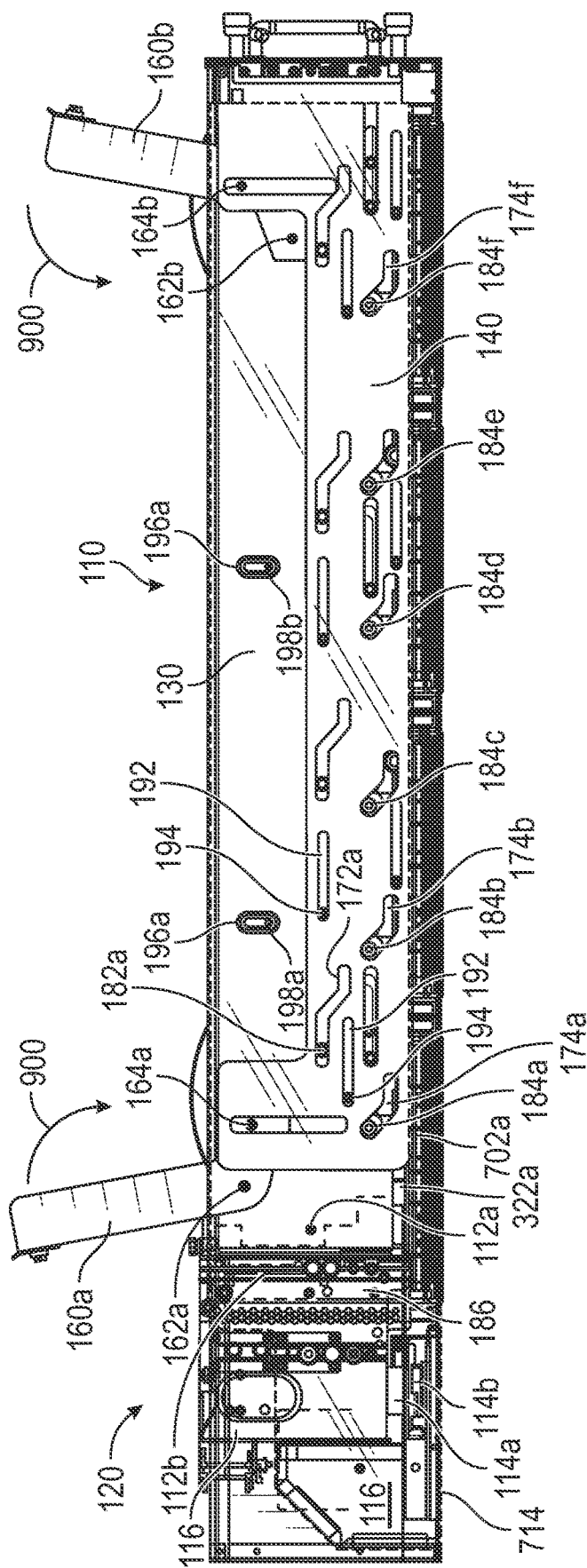
FIG. 9A is a front view illustrating elements of the embodiment of a connection mechanism of FIG. 1 in a first state.

Face 200 includes track followers 194 and 198a-e (FIG. 8A and FIG. 9A). Track followers 194 extend into guide tracks 192 of slider 140, limiting slider 140 to sideways (horizontal as shown) motion. Track followers 198a-e extend into guide tracks 196a-e of elevator 130, limiting elevator 130 to vertical motion.

Handles 160a-b include track followers 164a-b that travel within tracks 170a-b. The orientation of pivots 162a-b and track followers 164a-b is flipped between handle 160a and handle 160*b*. As a result, with upward and outward rotation of handles 160*a-b*, slider 140 is moved to the right with respect to elevator 130. The reverse movement of handles 160*a-b* moves slider 140 to the left with respect to elevator 130.

Slider 140 includes dual-plateau elevating tracks 172*a-d*, single-plateau elevating tracks 174*a-f*, as well as guide tracks 192.

Elevator 130 includes connector voids 180*a-d*, which correspond to PCT connections 322*a-d* (FIG. 3), track followers 182*a-d*, which follow dual-plateau elevating tracks 172*a-d*, track followers 184*a-f*, which are connected to sliders 150*a*, 150*b*, and which follow single-plateau elevating tracks 174*a-f*, and guide tracks 196*a-e*, which engage track followers 198*a-e* of face 200.

In the embodiment of FIG. 2, the tracks, e.g., tracks 170*a-b*, tracks 172*a-d* tracks 174*a-f*, tracks 192, tracks 194, and tracks 196, are depicted as slots and the corresponding track followers are depicted as pins. However, in other embodiments, tracks may include other configurations, such as grooves or rails, with the associated track followers configured to follow the different configuration. For example, a groove may be followed with a pin, nub, or tab, and a rail may be followed by a V-shaped or dual flanged track follower, or a combination of single-flanged track followers. Similarly, the positions of a track and a track follower may be swapped. For example, a track on slider 140 may be moved to elevator 130 and the associated track follower moved from elevator 130 to slider 140. One of skill will understand that the swap may require a re-configuration of the track shape to accomplish the same motion. For example, if track 170*b* were swapped to handle 160*b* it would need to assume a curved shape to cause the horizontal motion of slider 140.

Figure 3:
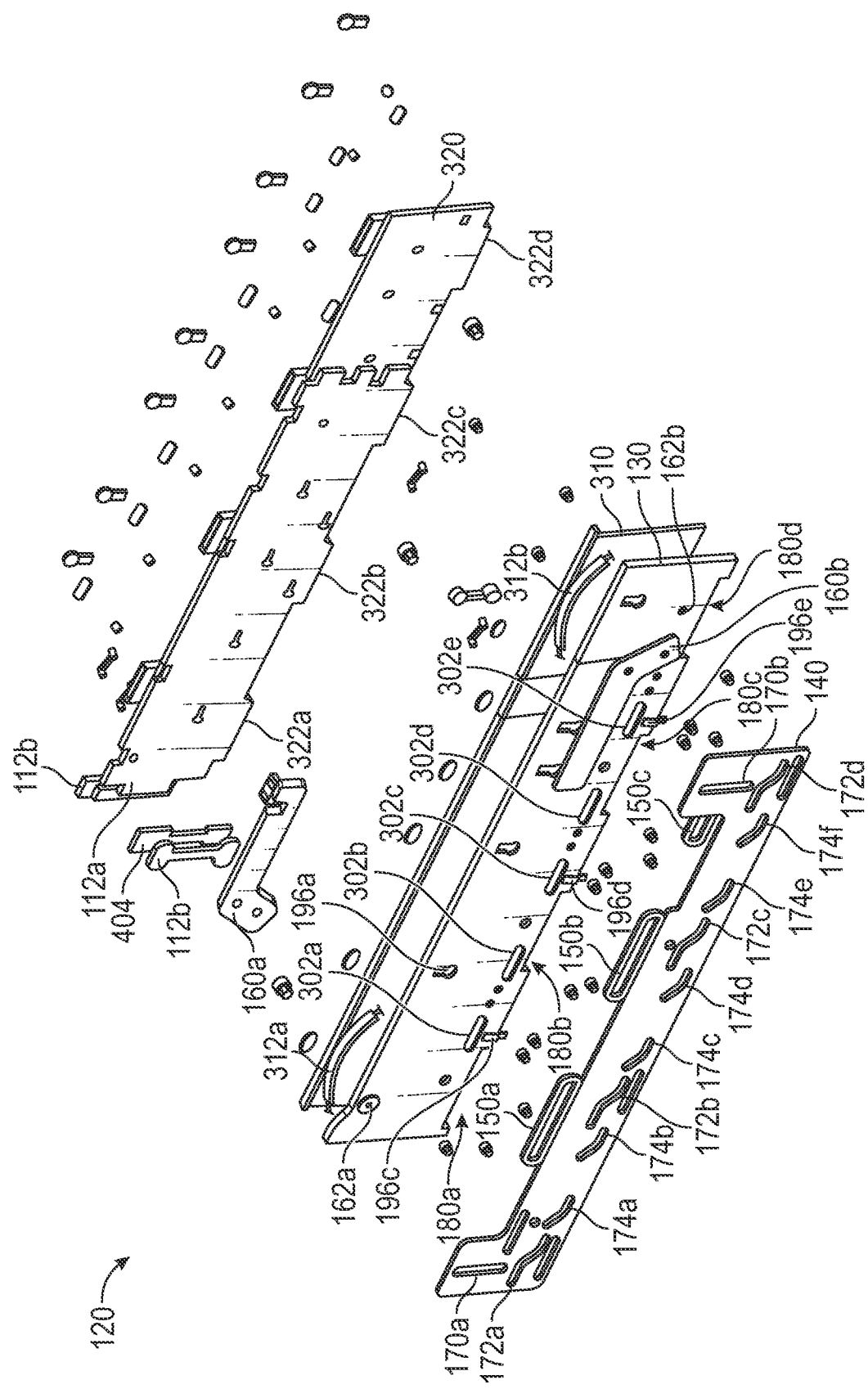
FIG. 3 is an assembly drawing illustrating aspects of the embodiment of a connection mechanism of FIG. 1.

FIG. 3 is an assembly drawing further illustrating and clarifying the relative positions of the elements discussed with regard to FIG. 2. FIG. 3 illustrates that handles 140*a-b* and mini-sliders 150*a-c* are sandwiched between slider 140 and elevator 130. Elevator 130 includes mini-slider tracks 302*a-f* that constrain the movement of mini-sliders 150*a-c* to horizontal motion with respect to elevator 130. In FIG. 3 cam-slider system 120 is shown to further include a PCB carrier 310 that carries (is connected to) a PCB 320. PCB carrier 310 includes handles 312*a-b* to facilitate connecting carrier 310 to elevator 130 by sliding carrier 310 down along the face of elevator 130 until slots 802*a* . . . 802*f* (FIG. 8A, FIG. 8B) receive pins 182*a* . . . *f*, and slots 708*a* . . . 708*c* of brackets 704*a* . . . 704*c* receive pins 710*a* . . . 710*c* of brackets 706*a* . . . 706*c*. Pins 710 within slots 708 allow motion of carrier 310 parallel to elevator 130, but retain the base of carrier 310 against elevator 130. This is discussed further with regard to FIG. 8A and FIG. 8B. PCB 320 includes connectors 322*a-d* and 112*a*. Connectors 322*a-d* connect to backplane connectors 702*a-d* (FIG. 7) and connector 112*a* is the PCB-side of paddle card connector 112*b*.

Figure 4:
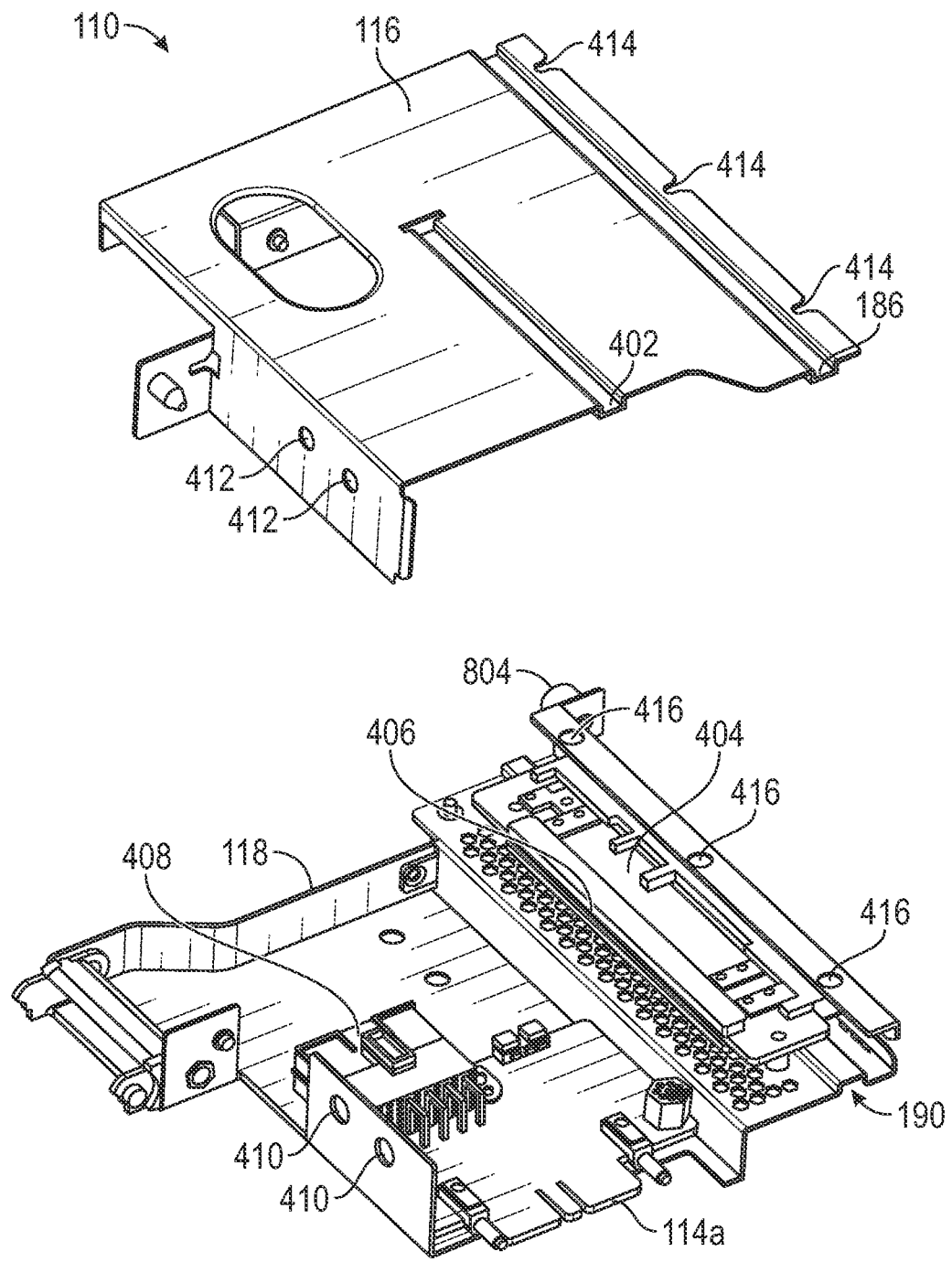
FIG. 4 is an assembly drawing illustrating aspects of the embodiment of a connection mechanism of FIG. 1.

FIG. 4 is an assembly drawing further illustrating and clarifying the relative positions of the elements discussed with regard to FIG. 2. In FIG. 4, paddle card cage 110 is shown to include paddle card 404 (the interior card from connector 112*b* (FIG. 2)) and connector 114*a*, which is connected to fan linking board connector 408 within shells 116, 118. Paddle card 404 is connected to PCB 320 by paddle card connectors 112*a-b* (mating parts of connector 112) and by cabling (not shown) connected to paddle card 404 at connector 406 to chassis signal and power cabling 30. Fan linking board connector 408 is connected by chassis connectors 114*a-b* (FIG. 9A) to fan board 714 (FIG. 7) and by cabling (not shown) to chassis signal and power cabling 30. Shell 116 connects to shell 118 with slots 414 sliding below the flange of shell 118 and engaging pins 416. Shell 118 is then fastened to shell 116 with fasteners at holes 410, 412.

Paddle card cage 110 includes slots 186 and 402 which engage with protrusions (not shown) on the inner adjacent face of chassis 10 to constrain paddle card cage 110 to vertical motion (as oriented in the figures). A slot 190 on the other side off shell 118 from slot 186 is constrained by pins 188 of guide bracket 187 attached to chassis 10 (see FIG. 7). A thumb screw 804 connects paddle card cage 110 to elevator 130, with both being limited to vertical motion (as oriented in the drawings).

Figure 5:
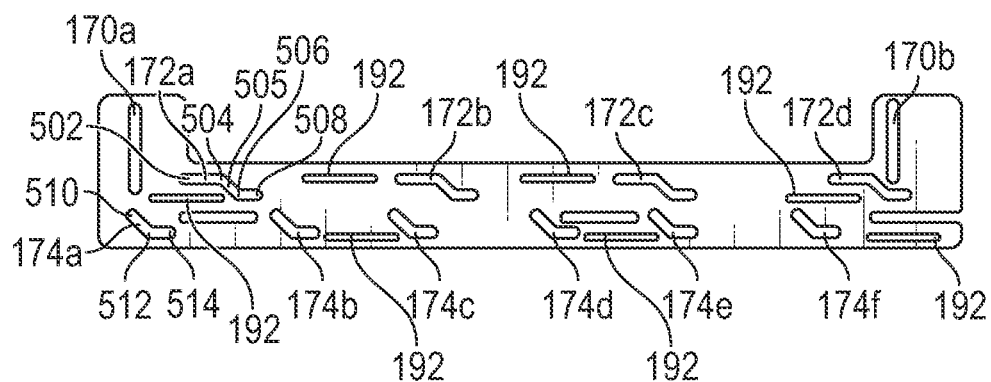
FIG. 5 is a front view illustrating elements of the embodiment of a connection mechanism of FIG. 1.

FIG. 5 is a front view further illustrating and clarifying the relative positions of the elements discussed with regard to FIG. 2. In FIG. 5, the following description of track 172*a* applies to tracks 172*a-d* and the description of track 174*a* applies to tracks 172*a-f*. Dual-plateau elevating track 172*a* is shown to have a first, upper plateau 502, first elbow 504, a second elbow 506, and a second lower plateau 508, with first plateau 502 and second plateau separated by a transition 505. Single-plateau elevating track 174*a* is shown to have a transition section 510, an elbow 512, and a lower plateau 514.

Figure 6:
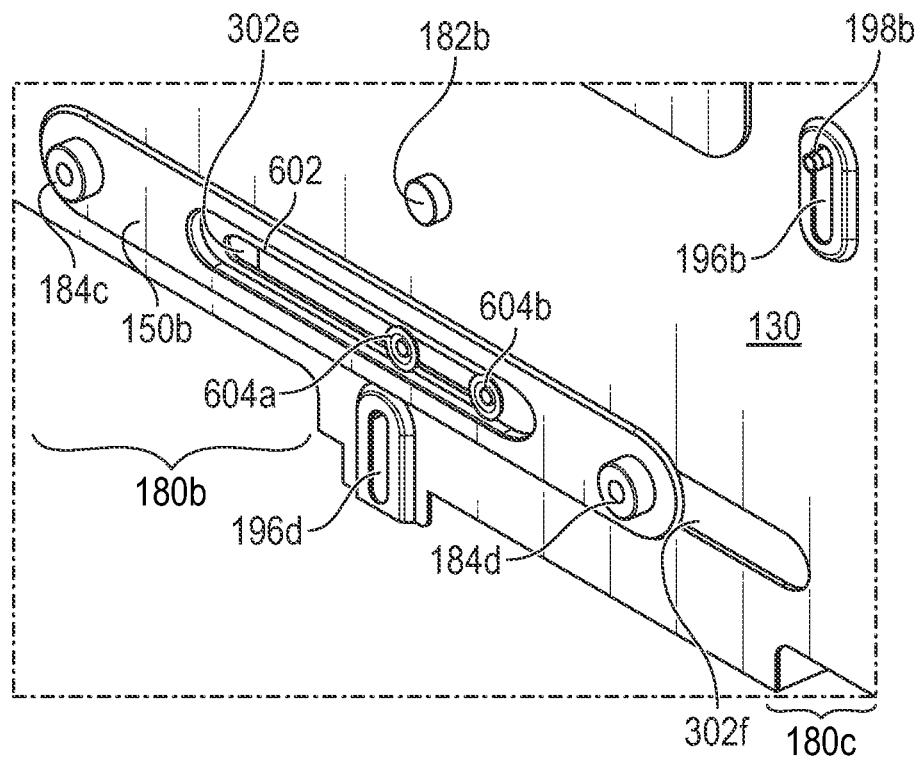
FIG. 6 is an isometric upper right front view illustrating elements of the embodiment of a connection mechanism of FIG. 1.

FIG. 6 is an isometric upper right front view further illustrating and clarifying the relative positions of the elements discussed with regard to FIG. 2. In FIG. 6, the description of mini-slider 150*b* applies equally to mini-sliders 150*a-c*. Mini-slider 150*b* is shown to include a track 602 and to be fastened to elevator 130 with fasteners 604*a-b*, which cooperate with track 602 to constrain mini-slider 150*b* to horizontal motion with respect to elevator 130. The front portions of track followers 184*c-d* visible FIG. 6 follow tracks 174*c-d* of linking slider 140, respectively. Rear portions of track followers 184*c-d*, not visible in FIG. 6 (see FIG. 7), follow tracks 302*e-f* within elevator 130 respectively, which also constrains mini-slider 150*b* to horizontal motion with respect to elevator 130. Track followers 184*c-d*, within single-plateau elevating tracks 174 provide for both horizontal and vertical motion of linking slider 140 with respect to elevator 130.

Figure 7:
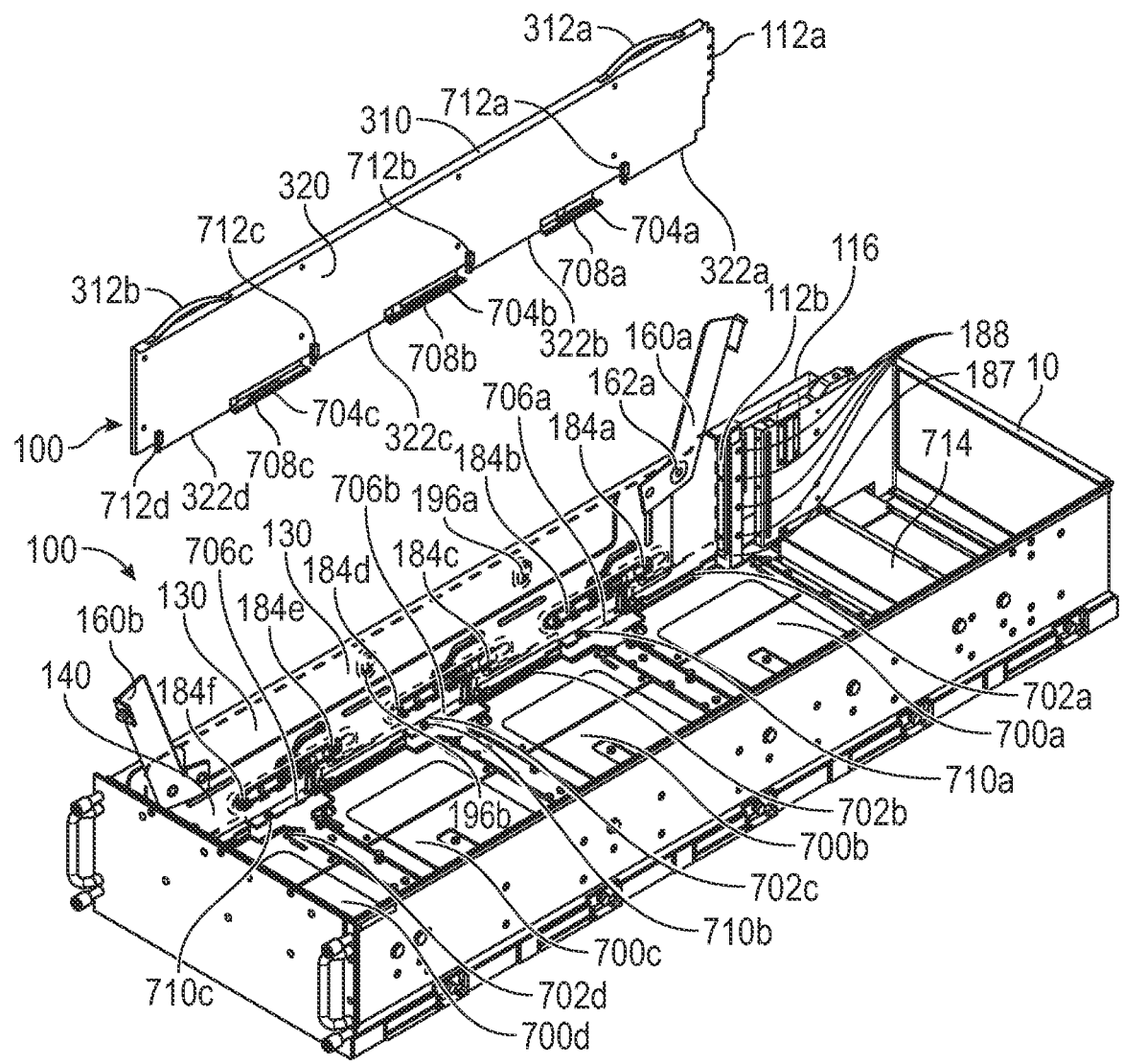
FIG. 7 is an isometric upper right rear view illustrating elements of the embodiment of a connection mechanism of FIG. 1.

FIG. 7 is an isometric upper right rear view illustrating elements of the embodiment of connection mechanism 100 of FIG. 1. In FIG. 7, chassis 10 is shown to include backplanes 700*a-d*, which are configured to accept drives 20 (drive connectors not shown), and a fan board 714. Each backplane 700*a-d* includes a backplane connector 702*a-d*. PCB carrier 310 is shown carrying PCB 320 and to include brackets 704*a-c*. In an embodiment, PCB 320 is fastened to carrier 310 using screws prior to being dropped into elevator 130. In an embodiment, PCB 320 may be held by carrier 310 by a slot (not shown) at the top of carrier 310 that accepts the top of PCB 320, and by clips 712*a-d* at the bottom of carrier 310 that retain the bottom edge of PCB 320. Elevator 130 includes brackets 706*a-c*, which correspond to brackets 704 *a-c*. To install PCB 320 and carrier 310, carrier 310 is lowered down along the inner side of elevator 130 until brackets 704*a-c* contact brackets 706*a-c*. With carrier 310 so lowered against elevator 130, track followers 710*a-c* of brackets 706*a-c* are inserted into tracks 708*a-c* of brackets 704*a-c*, which maintains carrier 310 in position against elevator 130.

FIG. 8A is an isometric upper right rear view further illustrating the connection of carrier 310 with PCB 320 to elevator 130. In FIG. 8A, PCB 320 is rendered partially transparent to better illustrate the connection of carrier 320 to elevator 130. Carrier 130 includes slots 802a-f (slots 802c-f are not shown for convenience, but the description of 802a-b applies equally to slots 802c-f), which are configured to receive track followers 184a-f, respectively. To connect carrier 310 to elevator 130, carrier 310 is lowered in direction 800 against the rear face of elevator 130 until brackets 704-c abut brackets 706a-c. During this motion, track followers 184a-f are received by slots 802a-f and track followers 710a-c are received by tracks 708a-c.

FIG. 8A further illustrates that mechanism 100 includes a paddle card cage guide bracket 186 attached to chassis 10 and including track followers 188, which follow track 190 within paddle card cage 110. Bracket 186 thus constrains paddle card cage 110 to motion parallel to direction 800.

Figure 8B:
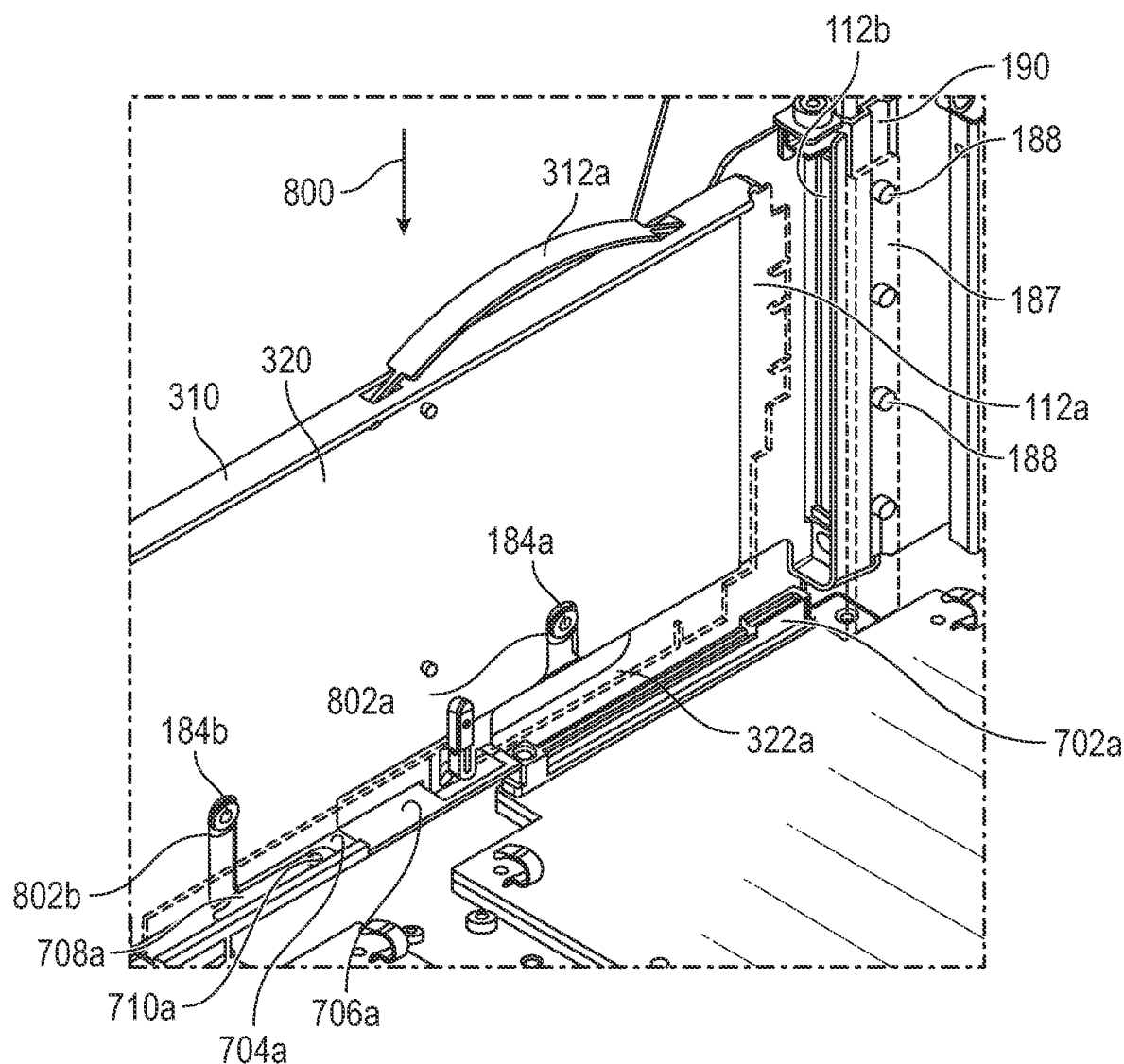
FIG. 8B is an isometric upper right rear view illustrating elements of the embodiment of a connection mechanism of FIG. 1 in a second state.

FIG. 8B is an isometric upper right rear view further illustrating the connection of carrier 310 with PCB 320 to elevator 130. In FIG. 8B, carrier 310 has been lowered until it is seated against elevator 130. Thus, as shown in FIG. 8B, track followers 184a-f prevent relative horizontal motion in a first axis between carrier 310 and elevator 130, and track followers 710a-c prevent relative horizontal motion in a second axis between carrier 310 and elevator 130, which maintains connectors 322a-c properly positioned with respect to elevator 130 for eventual connection to connectors 702a-d.

The general operation of connection mechanism 100 is as follows. Paddle card cage 110, elevator 130, linking slider 140, handles 160a, 160b, card carrier 310, and middle board 320 move in planes parallel to face 200. Elevator 130 and paddle card cage 110 are constrained to vertical motion toward and away from connectors 702 and 114b. Linking slider is constrained to move laterally with respect to toward or away from paddle card cage 110. The motion of elevator 130 controls the motion of paddle card cage 110. Elevator 130 is driven up and down by linking slider, and more specifically by track followers 182a . . . d being driven up or down by ramp sections 505 of tracks 172a . . . d of linking slider 140. When linking slider 140 is moved toward paddle card cage 110, track followers 182 travel along the high side 502 of tracks 172, then descend ramp 505 to low side 508 of tracks 172, the descent forcing elevator 130 to descend and complete the lower board connections. The travel of track followers 182 along high side 502 of tracks 172 accommodates the movement of card carrier 310 toward paddle card cage 110. At the end of this movement along high side 502 of tracks 172, connectors 112a and 112b are mated. The horizontal movement of card carrier 310 with respect to elevator 130 is caused by the pivoting inward of handles 160a, 160b.

An initial inward pivot causes cam pins 164a, 164b, within tracks 170a, 170b to drive linking slider 140 toward paddle card cage 110. This movement is permitted by horizontal movement of track followers 182 along high side 502 of tracks 172. The corresponding horizontal movement of card carrier 310 is caused by slider 140 pushing track followers 184a . . . f toward paddle card cage 110. Track followers 184a . . . f, in turn drive card carrier 310 toward paddle card cage 110. Since elevator 130 is positioned between slider 140 and card carrier 310, and track followers 184a . . . 184f connect through elevator 130, mini-sliders 150a . . . c and tracks 302a . . . f (within elevator 130) are provided to allow for the horizontal motion of track followers 184 without requiring horizontal motion of elevator 310. With the conclusion of this initial inward pivot, horizontal movement of card carrier 310 is complete, and connectors 112a, 112b are mated.

Further inward pivoting of handles 160, 160b causes linking slider 140 to travel further toward paddle card cage 110. This additional movement causes ramps 505 of tracks 172 to force track followers 182 to descend. Simultaneously, track followers 184a . . . f descend down the ramps of tracks 174a . . . f. Thus, this additional inward pivot of handles 160a, 160b causes both elevator 130 and card carrier 310 to descend and mate the connectors 114a and 322a . . . d. The sequence for disconnecting is the reverse of the above process.

FIG. 9A-FIG. 12B will be referred to in describing how connection mechanism 100 is used to electrically connect backplanes 700a-d to signal and power cabling 30 (FIG. 1) and connect fan board 714 to chassis signal and power cabling 30. This description will be directed to the section of connection mechanism 100 shown in FIG. 9B and the elements therein, but should be understood to apply to the other elements of connection mechanism 100 that are identical, e.g., description of dual-plateau track 172a applies equally to tracks 172b-d. In FIG. 9A-FIG. 12B, face 200 is transparent to aid in the description.

Figure 9B:
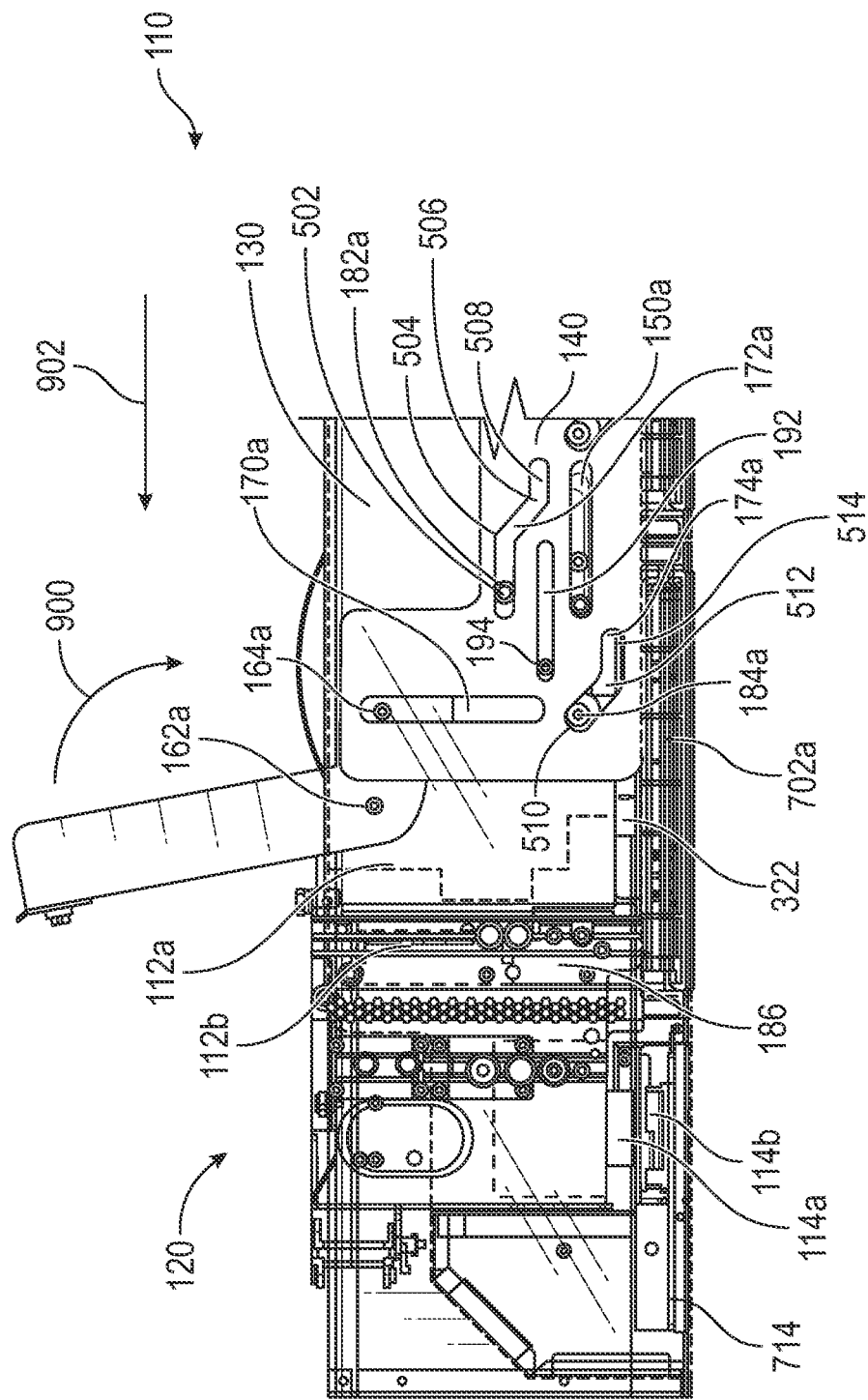
FIG. 9B is an enlarged front view illustrating elements of the embodiment of a connection mechanism of FIG. 9A.

FIG. 9A is a front view illustrating elements of the embodiment of a connection mechanism of FIG. 1 in a first state with PCB 320 installed in carrier 310, and carrier 310 seated against elevator 130 (as shown in FIG. 8B from behind). FIG. 9B is an enlarged front view of the indicated section of FIG. 9A.

In FIG. 9B, the mating of paddle card connector 112a to 112b is begun by rotating handles 160a-b partially inward 900 a first arcing distance, which rotates them about pivots 162a-b, causing track followers 164a-b to force slider 140, elevator 130, carrier 310 (FIG. 8B), and PCB 320 (FIG. 8B) in direction 902 with respect to face 200 (FIG. 2) and paddle card cage 110. During this motion, track follower 182a moves within track section 502. Similarly, mini-slider 150a moves in direction 902 along track 602 (FIG. 6), which permits track follower 184a to remain in the upper part of transition section 510. This first rotation of handles 160a-b does not cause slider 140, elevator 130, carrier 310, or card 320 to move in direction 904 toward connector 702a.

Note that track followers 194 are attached to face 200 of chassis 10. Thus, track followers 194 travelling within tracks 192 limit slider 140 to lateral motion with respect to face 200, which is parallel with direction 902.

Figure 10A:
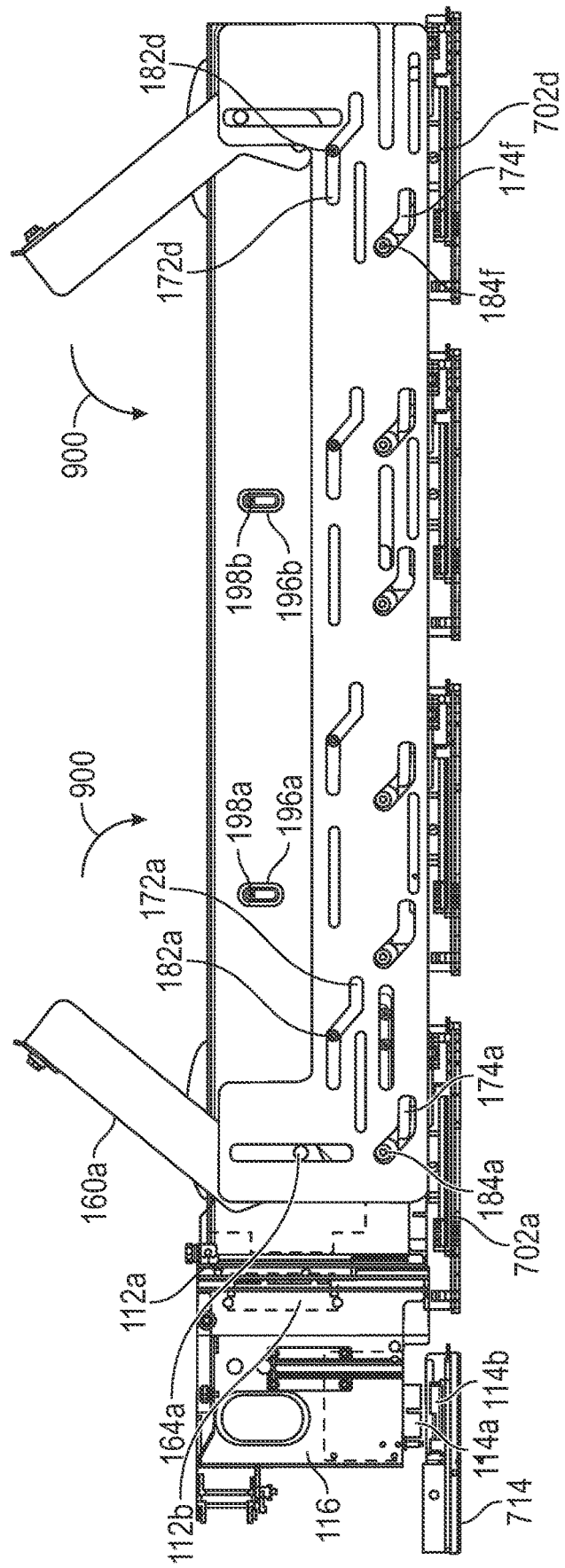
FIG. 10A is a front view illustrating elements of the embodiment of a connection mechanism of FIG. 9A in a second state.
Figure 10B:
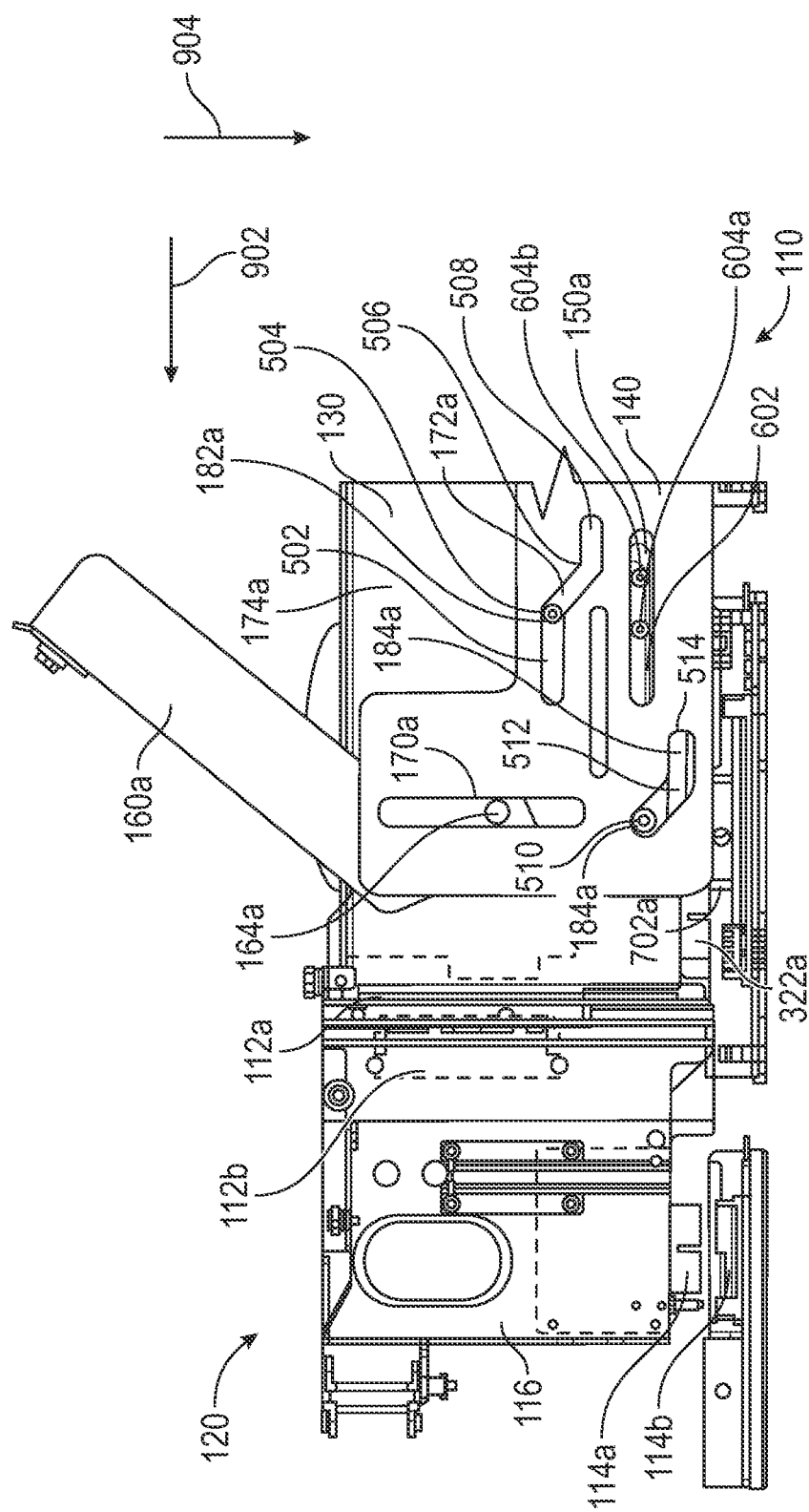
FIG. 10B is an enlarged front view illustrating elements of the embodiment of a connection mechanism of FIG. 10A.

FIG. 10A is a front view illustrating elements of the embodiment of a connection mechanism of FIG. 9A in a second state. FIG. 10B is an enlarged front view of the indicated section of FIG. 10A.

FIG. 10B illustrates cam-slider system 110 after handles 160a-b have been rotated inward a first arcing distance and paddle card connector 112a is moved in direction 902 and mated to connector 112b. During this motion, track follower 182a has moved within track section 502 to elbow 504. Mini-slider 150a has moved in direction 902 along track 602 (FIG. 6), which permitted track follower 184a to remain in the upper part of transition section 510. This first rotation of handles 160a-b has not caused slider 140, elevator 130, carrier 310, or card 320 to move in direction 904 toward connector 702a. Similarly, paddle card connector 114a has not moved in direction 904 toward connector 114b. In FIG. 10B, elevator 130, carrier 310, and PCB 320 are prevented from travelling further in direction 902 by paddle card cage 110. Similarly, it can be seen that mini-slider 150a is prevented from further travel in direction 902 by fastener 604b.

Figure 11A:
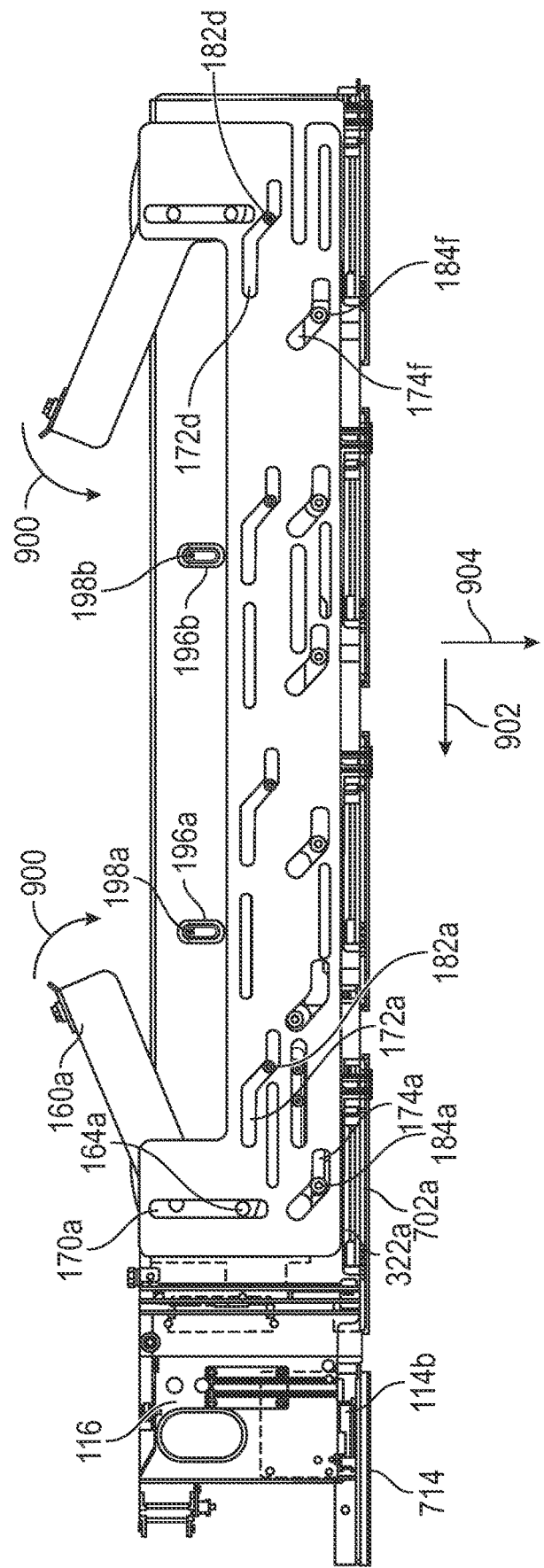
FIG. 11A is a front view illustrating elements of the embodiment of a connection mechanism of FIG. 9A in a third state.
Figure 11B:
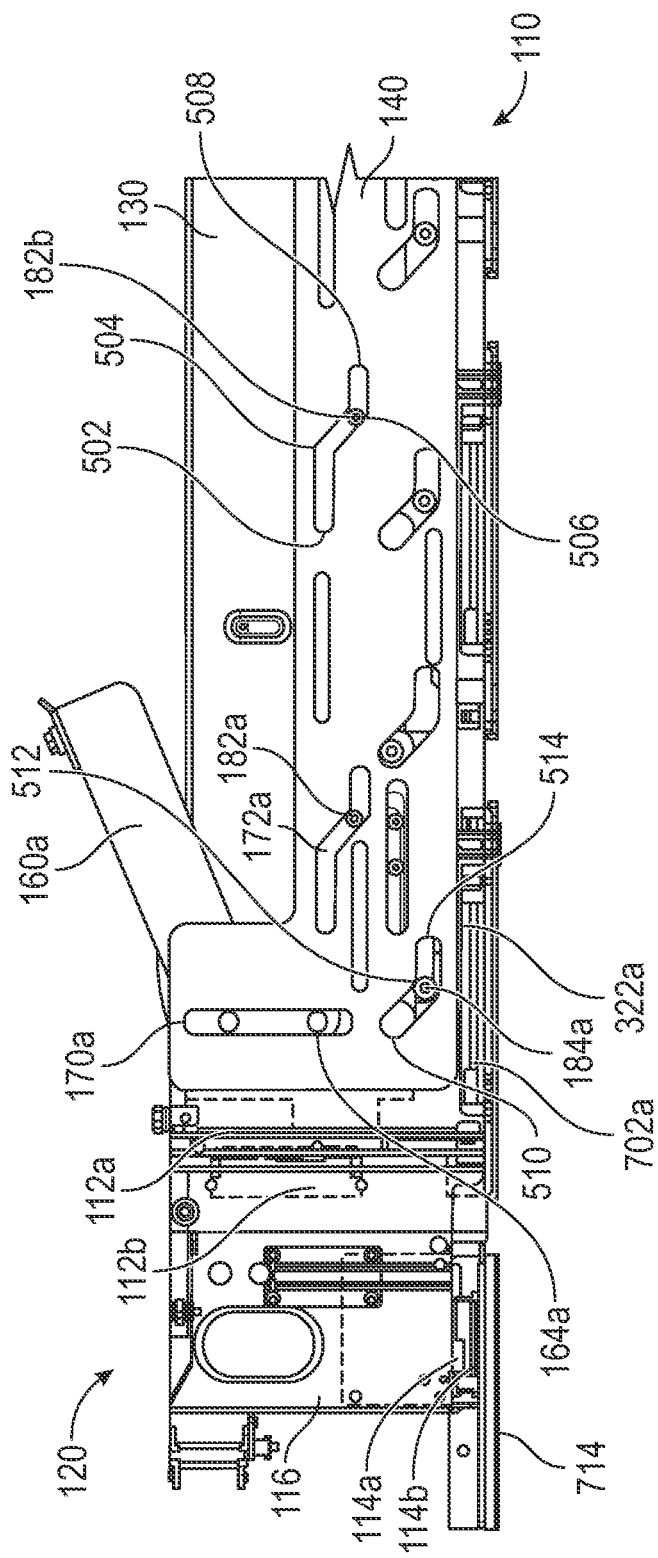
FIG. 11B is an enlarged front view illustrating elements of the embodiment of a connection mechanism of FIG. 11A.

FIG. 11A is a front view illustrating elements of the embodiment of a connection mechanism of FIG. 9A in a third state. FIG. 11B is an enlarged front view of the indicated section of FIG. 11A.

FIG. 11B illustrates cam-slider system 110 after handles 160a-b have been rotated inward a second arcing distance, which has caused connection mechanism 100 (except slider 140) to travel in direction 904. As a result, PCB connector 322a is mated to backplane connector 702a and paddle card connector 114a it mated to connector 114b.

The downward motion 902 of elevator 130, PCB 320, carrier 310, and paddle card cage 110 resulted from constraints on the motion of the different elements. Elevator 130, carrier 310, and PCB 320 were prevented from travelling further in direction 902 by paddle card cage 110. Slider 140 was constrained to motion along direction 902 by tracks 192. Rotation of handles 160a-b caused relative motion between slider 140 and elevator 130, with slider 140 moving in direction 902 with respect to elevator 130. This relative motion caused track follower 182a to move along track 172a in downward angle from elbow 504 to elbow 506. Similarly, track follower 184a was forced to move along track 174a in a downward angle to elbow 512. However, with elevator 130 constrained to motion in parallel with direction 904, and slider 130 constrained to motion in parallel to direction 902, the relative motion between slider 130 and elevator 140 (as illustrated by track follower 182a moving diagonally from elbow 504 to elbow 506) resulted in elevator 130 being forced downward 902 by track followers 182a and 184a. Similarly, paddle card cage 110 was forced downward 902 by being connected to elevator 130, causing connector 114a to mate with connector 114b.

Figure 12A:
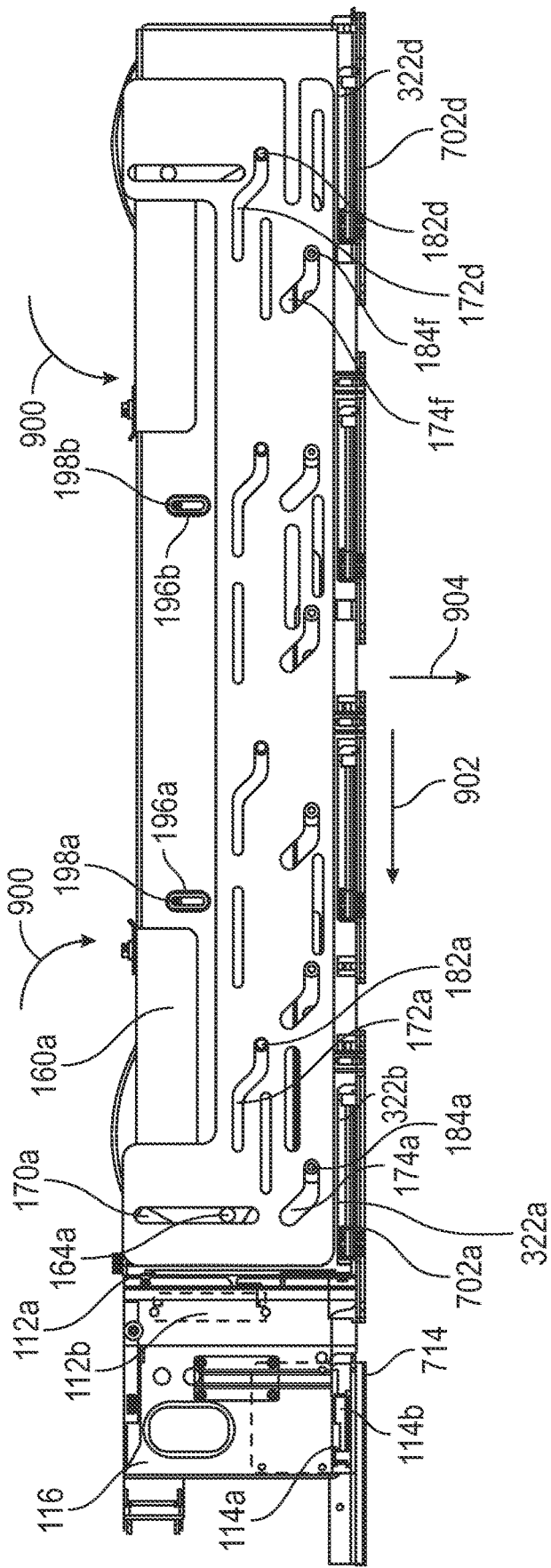
FIG. 12A is a front view illustrating elements of the embodiment of a connection mechanism of FIG. 9A in a fourth state.
Figure 12B:
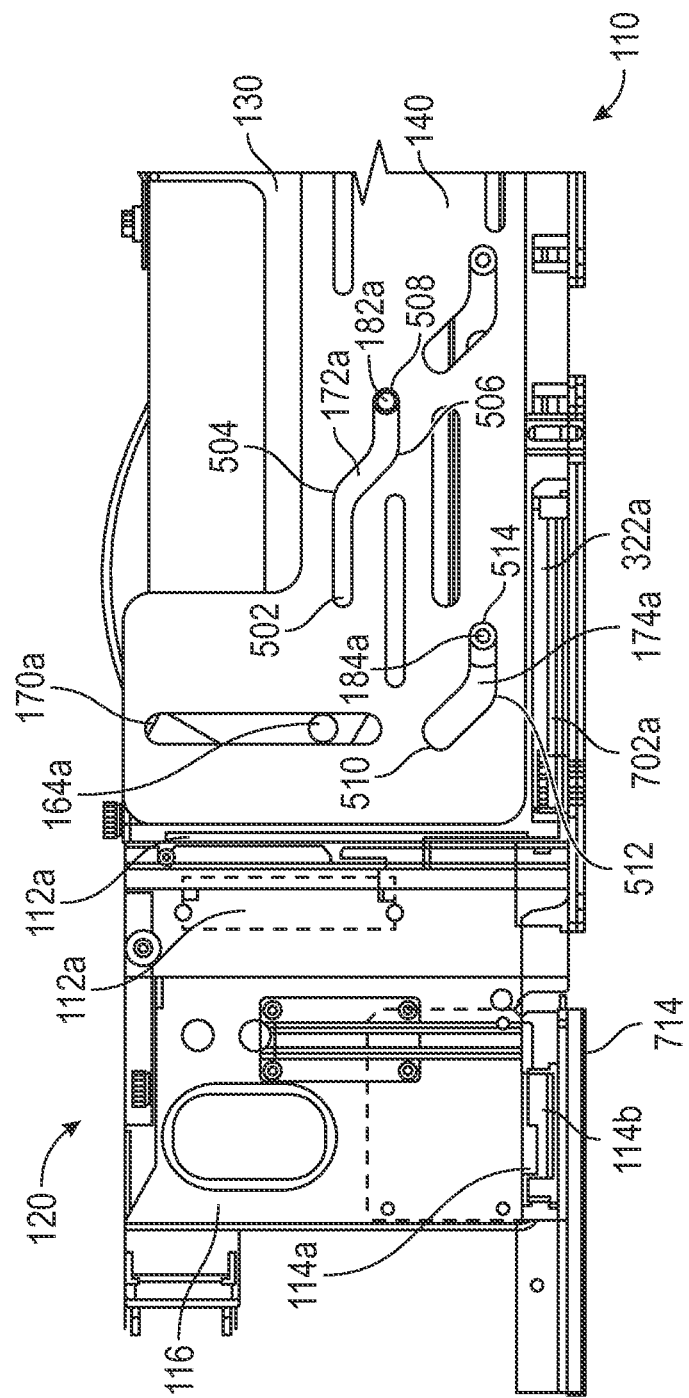
FIG. 12B is an enlarged front view illustrating elements of the embodiment of a connection mechanism of FIG. 12A.

FIG. 12A is a front view illustrating elements of the embodiment of a connection mechanism of FIG. 9A in a fourth state. FIG. 12B is an enlarged front view of the indicated section of FIG. 12A.

In FIG. 12B, handles 160a-b have been rotated a third arcing distance inward from the position shown in FIG. 11B. The change from FIG. 11B to FIG. 12B represents a locking action. In FIG. 11B, connections 114a to 114b and 322a to 702a were made. The further movement of handles 160a-b shown in FIG. 12A has moved slider 140 further in direction 902 with respect to elevator 130. This movement has caused track follower 182a to travel to end 508 and track follower 184a to travel to end 514. Thus, both track followers 182a, 184a resist upward forces that might dislodge connectors 322a, 114a.

In an embodiment, a method of using a connector mechanism 100 includes the following steps: 1) a user drops carrier 310 with affixed PCB 320 in elevator 130; 2) the user rotates and closes handles 160a-b. When the user performs step 2), connection mechanism performs the following steps: A) handles 160a-b push slider 140 in direction 902 by the action of track followers 164a-b within tracks 170a-b; B) tracks 174a-f on slider 140 push track followers 184a-f on mini-sliders 150a-c in direction 902; C) when track followers 182a-d reach elbows 504 and fasteners 604b limit further travel of mini-sliders 150a-c, paddle card connector 112a will be fully connected to connector 112b; D) further rotation of handles 160a-b causes track followers 182a-d and 184a-f to travel downward in their respective tracks, forcing elevator 130 in direction 904; E) the motion of elevator 130 brings with it carrier 310 and PCB 320, connecting connectors 322a-d to connectors 702a-d and connector 114a to connector 114b; and F) with handles 160a-b fully rotated, connection mechanism 100 locks, resisting upward forces that might dislodge connectors 322a-d and 114b.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

At times, for convenience movement and orientations may be referred to as "horizontal" or "vertical," or "up" or "down." One of skill will realize that this is with regard to the apparatus as it is illustrated in the drawing and not with reference to the Earth. All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a chassis including a first connector, a second connector, and a face;
a first slider constrained to move along a first axis parallel to the face by a first track follower engaging a first track;
an elevator constrained to move along a second axis perpendicular to the first axis and parallel to the face by a second track follower engaging a second track; a handle pivotably connected between the first slider and the elevator, the handle pivotable through a first arc section causing the first slider to move a first distance, and pivotable through a second arc section causing the first slider to move a second distance;
a carrier configured to removably attach a card to the elevator, the card including a third connector and a fourth connector, the third connector mating to the first connector with movement parallel to the first axis and the fourth connector mating to the second connector with movement parallel to the second axis, the carrier, when connected to the elevator:
constrained to follow movement of the elevator along the second axis, and
permitted, by a third track follower engaging a third track, to move along the first axis with respect to the elevator;

a fourth track follower engaging a fourth track of the first slider, the fourth track having a first ramp section angled with respect to the first axis;

a fifth track follower engaging a fifth track of the first slider, the fifth track having a second ramp section parallel to the first ramp section, wherein:

when the carrier is mounted to the elevator, movement of the first slider the first distance causes the fourth track follower to move the first distance and drive the carrier the first distance toward the first connector;

movement of the first slider the second distance causes the fifth track follower to move a perpendicular distance, parallel to the second axis, and drive the elevator the perpendicular distance toward the second connector; and movement of the carrier the first distance is sufficient to mate the third connector to the first connector, and movement of the carrier the perpendicular distance is sufficient to mate the fourth connector to the second connector.

2. The apparatus of claim 1, wherein:
the fifth track includes a first parallel section parallel to the first axis;
the second ramp section connects to the first parallel section;
movement of the first slider the first distance causes the fifth track follower to move the first distance along the first parallel section; and
movement of the first slider the second distance causes the fourth track follower to move the perpendicular distance and along the first ramp section, and causes the fifth track follower to move the perpendicular distance and along the second ramp section.

3. The apparatus of claim 2, wherein:
the fourth track includes a second parallel section parallel to the first axis;
the second parallel section connects to the first ramp section;
the fifth track further includes a third parallel section parallel to the first parallel section;
the second ramp section connects the first parallel section to the third parallel section;
the handle is pivotable through a third arc section;
movement of the handle through the third arc causes the slider to move a third distance parallel to the first axis; and
movement of the slider the third distance causes the fourth track follower to move the third distance within the second parallel section and causes the fifth track follower to move the third distance within the third parallel section.

4. The apparatus of claim 3, wherein:
movement of the slider the third distance does not cause movement of the elevator or the carrier.

5. The apparatus of claim 1, wherein:
the first track follower includes a first pin connected to the face and the first track includes a first slot disposed in the slider; and
the second track follower includes a second pin connected to the face and the second track includes a second slot disposed in the elevator.

6. The apparatus of claim 5, wherein:
the handle is pivotable about a point on the elevator; and
the handle includes a third pin travelling within a third slot disposed in the slider parallel to the second axis.

7. The apparatus of claim 5, further including a second slider disposed between the first slider and the elevator and constrained by a sixth track follower engaging a sixth track to move parallel to the first axis, wherein:
the fourth track follower includes a fourth pin and is connected to the second slider;
movement of the handle through the first arc section causes the first slider to move the fourth track follower and the second slider the first distance; and
movement of the handle through the second arc section does not cause movement of the fourth track follower or the second slider along the first axis.

8. The apparatus of claim 1, the chassis further including a connector housing connected to the first connector, wherein:
the housing is constrained to movement parallel to the second axis with respect to the face; and
when the first connector is connected to the third connector, movement of the carrier the perpendicular distance causes the connector housing to move the perpendicular distance.

9. The apparatus of claim 8, wherein:
the connector housing further includes a fifth connector electrically connected to the first connector;
the chassis includes a sixth connector; and
when the first connector is connected to the third connector, movement of the carrier the perpendicular distance causes the connector housing to move the perpendicular distance and the fifth connector to mate to the sixth connector.

10. The apparatus of claim 1, wherein:
the first track follower is disposed on the face and the first track is disposed on the first slider;
the second track follower is disposed on the face and the second track is disposed on the elevator;
the third track follower is disposed on the elevator and the third track is disposed on the carrier;
the fourth track follower follows the fourth track and a seventh track disposed on the carrier and oriented parallel to the second axis; and
the fifth track follower is disposed on the elevator.

* * * * *